US006741650B1

(12) United States Patent
Painchaud et al.

(10) Patent No.: US 6,741,650 B1
(45) Date of Patent: May 25, 2004

(54) ARCHITECTURE FOR INTERMEDIATE FREQUENCY ENCODER

(75) Inventors: Dean Painchaud, East Hartford, CT (US); Lawrence J Wachter, Oxford, CT (US)

(73) Assignee: ADC Telecommunications, Inc., Eden Prairie, MN (US)

(*) Notice: Subject to any disclaimer, the term of this patent is extended or adjusted under 35 U.S.C. 154(b) by 0 days.

(21) Appl. No.: 09/518,072

(22) Filed: Mar. 2, 2000

(51) Int. Cl.[7] ................................................. H04N 7/12
(52) U.S. Cl. ................................................. 375/240.21
(58) Field of Search ................................. 375/229, 214, 375/220, 240.12, 355; 329/306

(56) References Cited

U.S. PATENT DOCUMENTS

| | | | |
|---|---|---|---|
| 5,101,418 A | | 3/1992 | Critchlow et al. |
| 5,490,172 A | | 2/1996 | Komara |
| 5,495,203 A | * | 2/1996 | Harp et al. ............... 329/306 |
| 5,513,209 A | | 4/1996 | Holm |
| 5,732,333 A | | 3/1998 | Cox et al. |
| 5,970,093 A | | 10/1999 | De Lantremange |
| 6,031,431 A | | 2/2000 | Vinekar |
| 6,529,563 B1 | * | 3/2003 | Mosinskis et al. .......... 375/317 |
| 6,546,055 B1 | | 4/2003 | Schmidl et al. |

FOREIGN PATENT DOCUMENTS

| | | |
|---|---|---|
| EP | 0 360 178 | 3/1990 |
| EP | 0 817 369 | 1/1998 |
| EP | 0 859 523 | 8/1998 |
| GB | 2 296 611 | 7/1996 |
| WO | WO 99/09650 | 2/1999 |

OTHER PUBLICATIONS

ADC Telecommunications, "DV 6000, Intermediate Frequency (IF) Video Encoders and Decoders", pp. 1–4, Dec. 1998.

L.B. Jackson, *Digital Filters and Signal Processing*, Kulwer Academic Publishers, Boston, Chapters 6 and 11, 1986.

J.G. Proakis and D.G. Manolakis, *Digital Signal Processing*, Macmillan Publishing, Chapters 7 and 10, New York, 1992.

J. Smith, *Modern Communication Circuits*, McGraw Hill, pp. 188–198, 1986.

* cited by examiner

*Primary Examiner*—Stephen Chin
*Assistant Examiner*—Kevin Kim
(74) *Attorney, Agent, or Firm*—Fogg and Associates, LLC; David N. Fogg

(57) ABSTRACT

An encoder. The encoder includes an analog-to-digital (A/D) converter that receives an analog signal. The A/D converter downconverts and digitizes the analog signal without analog mixing of the analog signal. The encoder also includes a resampler that is coupled to the A/D converter. The resampler receives the digital signal and converts the downconverted digital signal to an output signal at a data rate independent of a data rate of the digitized analog signal.

37 Claims, 3 Drawing Sheets

ARCHITECTURE FOR INTERMEDIATE FREQUENCY ENCODER

RELATED APPLICATIONS

This application is related to co-pending and co-filed application Ser. No. 09/517,039, filed on Mar. 2, 2000, entitled "Architecture for Intermediate Frequency Video Decode" by inventors Dean Painchaud and Lawrence J. Wachter, which is hereby incorporated by reference. This application is further related to co-pending and co-filed application Ser. No. 09/517,685 filed on Mar. 2, 2000, now issued as U.S. Pat. No. 6,292,120 issued on Sep. 18, 2001, entitled "Automatic Gain Control for Input to Analog to Digital Converter" by inventors Dean Painchaud and Lawrence J. Wachter, which is hereby incorporated by reference.

TECHNICAL FIELD

The present invention relates generally to the field of telecommunications and, in particular, to an intermediate frequency video encoder used in conjunction with telecommunication transmission systems.

BACKGROUND

Currently, one type of system for the transmission of a signal includes the use of fiberoptics due to the high speed and long distance transmission capability of such a system. For one such system, signals (e.g., a video signal) having different data rates are modulated onto an intermediate frequency (IF) carrier and then digitized and formatted to a fixed data rate and transmitted over digital fiberoptic transmission lines.

Different encoders have been designed to digitize and format fixed data rate signals for transmission over the fiberoptic transmission lines. The design of such encoders involve the downconverting and digitizing of a bandpass input signal. Currently one approach in the design of such encoders has included analog mixing of the input signal prior to the analog to digital (A/D) conversion. Disadvantageously, this approach requires a relatively large amount of analog circuitry to precede the A/D conversion. Accordingly, any modification in the input signal, the sampling rate and/or input signal passbands of the encoder, or other design modifications translates into a significant amount of redesign of the analog circuitry. In other words, this type of approach is not very extensible due to the requirement of a redesign of the analog circuitry when there are modifications in the input signal or design of such an encoder.

A second approach to the design of such encoders has relied on undersampling followed by a fixed rate decimation of the A/D output data signal. The decimation process reduces the data rate of this A/D output data signal; however, this reduction is such that the input/output ratio of the data signals of the encoder must be integer-based. This approach has traditionally been used for the downconversion and digitization of narrowband (i.e., less than 500 kiloHertz (kHz)) bandpass signals. Disadvantageously, because of the requirement that the input/output ratio be integer-based, this approach is limited to working for certain discrete passbands.

For the reasons stated above, and for other reasons stated below which will become apparent to those skilled in the art upon reading and understanding the present specification, there is a need in the art for an intermediate frequency encoder that has a higher performance and minimal analog circuitry as well as one that outputs a signal at a fixed data rate for input signals having a wide range of data rates and frequency spectrums.

SUMMARY

The above mentioned problems with communication systems and other problems are addressed by the present invention and which will be understood by reading and studying the following specification. An encoder and a method for encoding that can be used in conjunction with communications systems is described. In particular, embodiments of such an encoder can be incorporated into fiberoptic communication systems wherein the encoder digitizes and formats an analog signal for transmission across fiberoptic transmission lines. The input signals to such systems are analog signals having both narrowband (i.e., less than 500 kHz) and wideband (greater than 500 kHz) bandpass signals. Further, embodiments of the encoder allow for extensibility as a relatively minimum amount of analog circuitry is incorporated in the design of such encoders. Accordingly, the majority of the signal processing and formatting of the signal is performed digitally.

In particular, an illustrative embodiment of the present invention includes an encoder. The encoder includes an analog-to-digital (A/D) converter that receives an analog signal. The A/D converter lowers the frequency spectrum of the analog signal. Additionally, the A/D converter digitizes the analog signal. The encoder also includes a resampler that is coupled to the A/D converter. The resampler receives the digital signal and converts the digital signal to an output signal. Further, the data rate of the output signal is independent of the data rate of the sampled analog signal.

Reference numbers refer to the same or equivalent parts of embodiment(s) of the present invention through several of the figures.

DETAILED DESCRIPTION

In the following detailed description, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
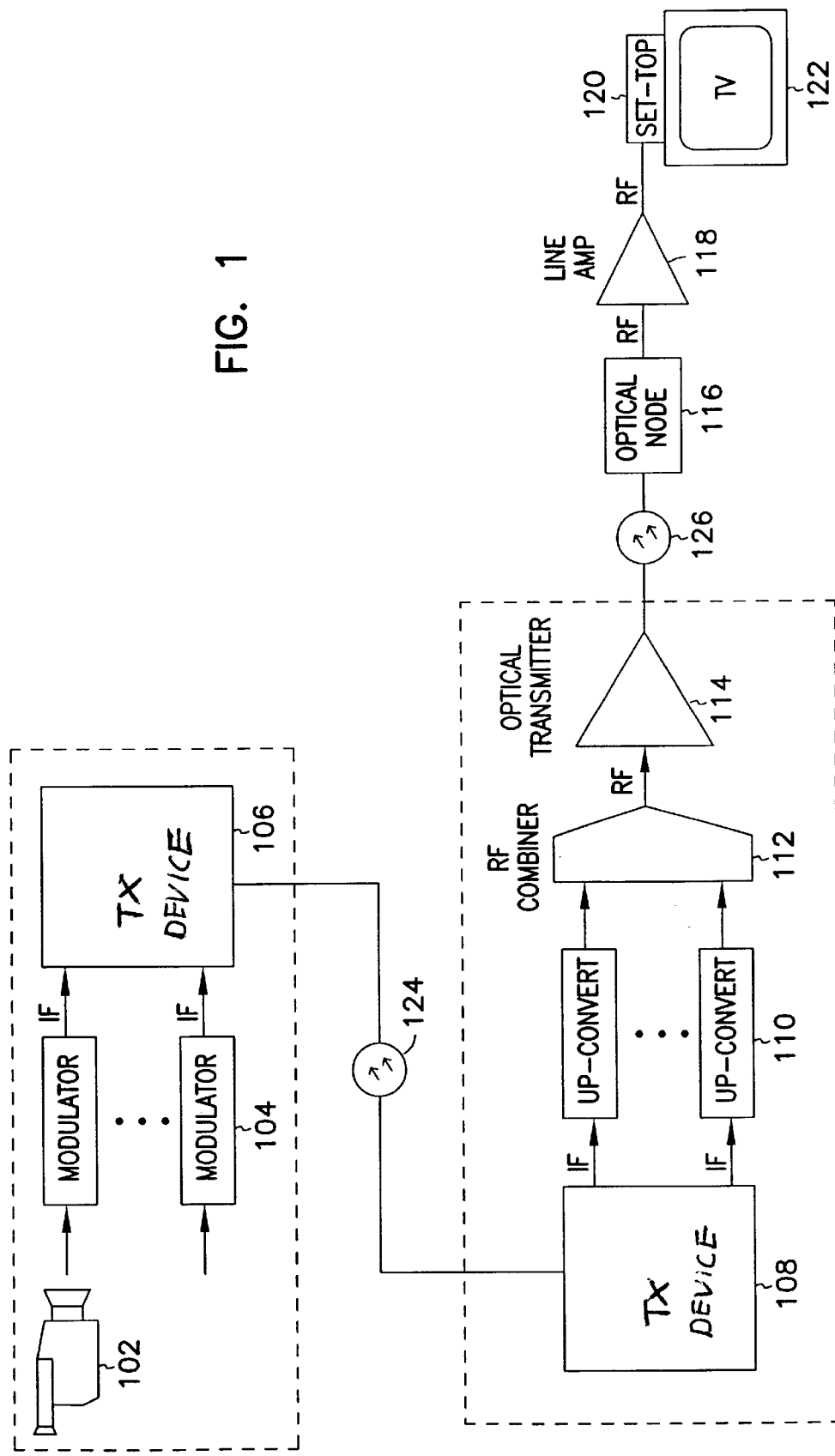
FIG. 1 is a representational diagram of an illustrative embodiment of a system that includes embodiments of the present invention.

FIG. 1 is a representational diagram of an illustrative embodiment of a system that includes embodiments of the present invention. In particular, FIG. 1 includes analog input device 102, modulator 104, transmission devices 106 and 108, upconverter 110, radio frequency (RF) combiner 112, optical transmitter 114, optical node 116, line amplifier 118, set-top box 120 and television 122. Analog input device 102 is coupled to modulator 104, which is coupled to transmission device 106. Additionally, transmission device 106 is coupled to transmission device 108 through transmission line 124. In one embodiment, transmission line 124 is a fiberoptic transmission line.

Further, transmission device 108 is coupled to upconverter 110, which is coupled to RF combiner 112. RF combiner 112 is coupled to optical transmitter 114. Moreover, optical transmitter 114 is coupled to optical node 11 through transmission line 126. In one embodiment, transmission line 126 is a fiberoptic transmission line. Optical node 116 is also coupled to line amplifier 118, which, in turn, is coupled to set-top box 120 that is coupled to television 122.

In operation, analog input device 102 generates an analog video signal which will be viewed by individuals on television 120 after transmission through the system of FIG. 1. In one embodiment, analog input device 102 is a video camera. The analog video signal is then transmitted to modulator 104 where the signal is modulated onto a carrier signal on a transmission line, which is coupled to transmission device 106. Transmission device 106 receives the carrier signal that includes the analog signal.

Using an encoder according to embodiments of the present invention, transmission device 106 digitizes and formats the analog signal for transmission over transmission line 124. Embodiments of such an encoder downconverts an analog signal during an A/D conversion and resamples the digitized signal to convert such a signal to one having an output data rate independent of the data rate of the sampled analog signal. Further, embodiments of such an encoder downconverts and digitizes an analog signal without analog mixing of such a signal. Moreover, embodiments of the encoder resample the digitized signal such that a ratio of the data rate of the sampled analog signal to the data rate of the output signal of the encoder is non-integer based.

After transmission across transmission line 124, transmission device 108 receives the digitized signal and reconstructs an analog signal from this digitized signal that is approximately the same as the original analog signal inputted into transmission device 106. In particular, transmission device 108 includes a decoder that reconstructs the analog signal. For more information on such a decoder, see copending/cofiled application Ser. No. 09/517,039, filed on Mar. 2, 2000, entitled "Architecture for Intermediate Frequency Video Decoder" by inventors Dean Painchaud and Lawrence Wachter.

Radio frequency (RF) combiner 112 receives the reconstructed analog signal from transmission device 108 and communicates the signal, as an RF signal, to optical transmitter 114. Optical transmitter 114 transmits this signal along transmission line 126 to optical node 116. Optical node 116 then transmits this signal as an RF signal to line amplifier 118 that amplifies and transmits the signal to set-top box 120 which formats the signal for viewing on television 122. This system illustrates only one signal being transmitted for purposes of illustration and not by way of limitation, as multiple signals can be transmitted in the system of FIG. 1. Further, the system of FIG. 1 illustrates the transmission of a video signal; however, any type of information-bearing signal can be transmitted through the system (e.g., audio and/or data signals).

Figure 2:
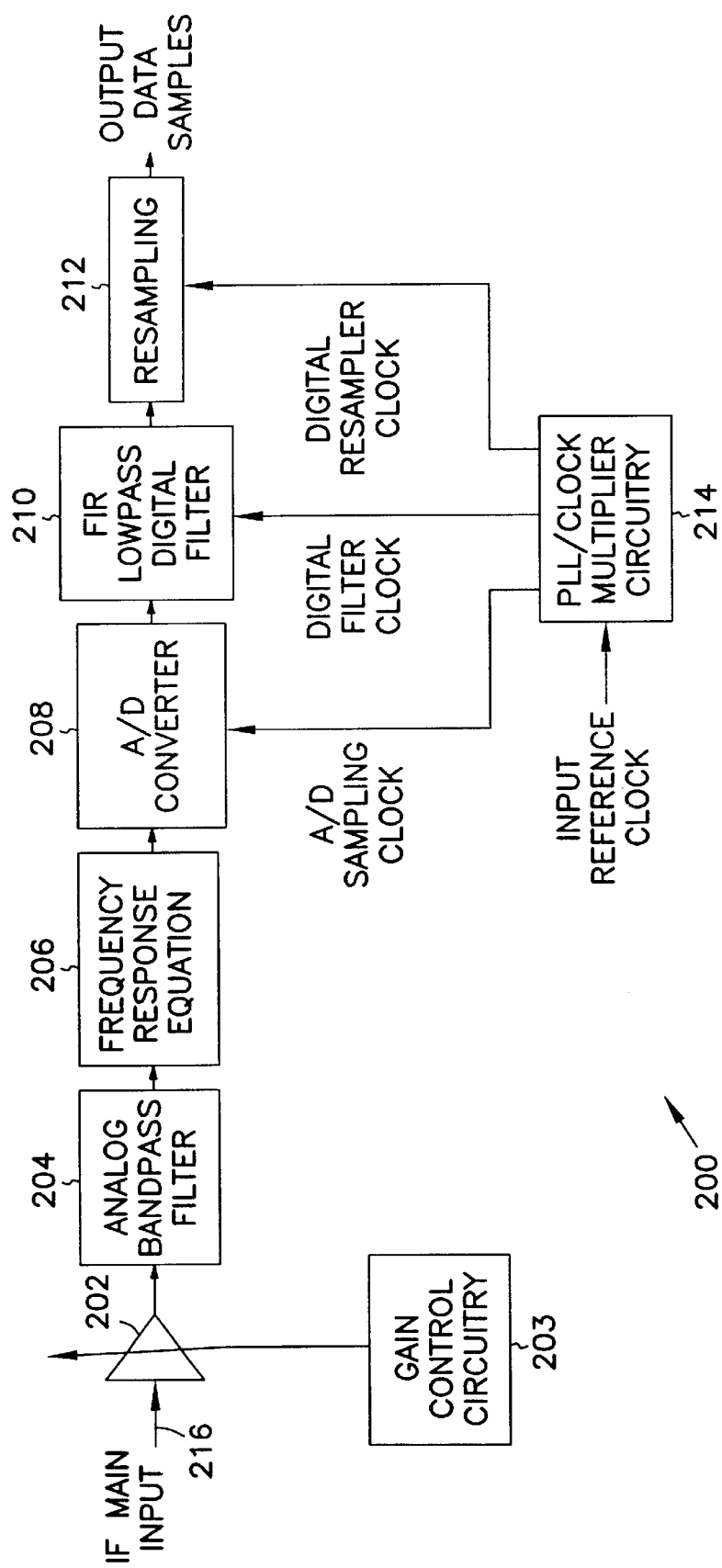
FIG. 2 is a representational diagram of an illustrative embodiment of an encoder according to the teachings of the present invention.

FIG. 2 is a representational diagram of an illustrative embodiment of an encoder according to the teachings of the present invention, which can be included in transmission device 106 of FIG. 1. In particular, FIG. 2 comprises encoder 200 that includes amplifier 202, gain control circuitry 203, analog bandpass filter 204, frequency response equalization circuitry 206, analog/digital (A/D) converter 208, digital filter 210, resampler 212 and PLL/clock multiplier circuitry 214.

Amplifier 202 is coupled to gain control circuitry 203, which is coupled to analog bandpass filter 204. Additionally, analog bandpass filter 204 is coupled to frequency response equalization circuitry 206, which, in turn, is coupled to A/D converter 208. A/D converter 208 is coupled to digital filter 210, which is coupled to resampler 212. Moreover, PLL/clock multiplier circuitry 214 is coupled to A/D converter 208, digital filter 210 and resampler 212.

Figure 3:
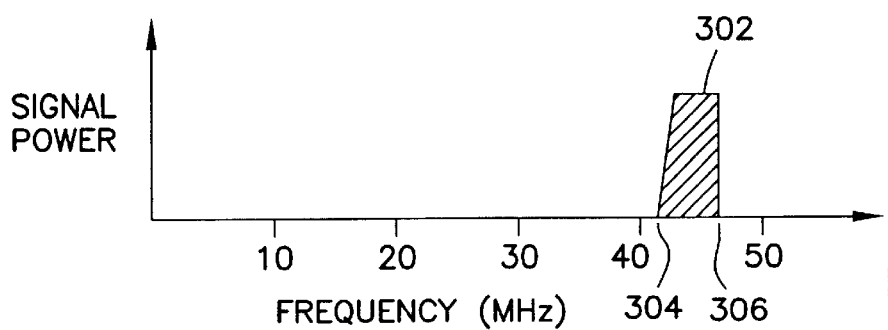
FIG. 3 illustrates an embodiment of a frequency spectrum of an input signal to embodiments of the encoder illustrated in FIG. 2.

In operation, input signal 216 is inputted into encoder 200 at amplifier 202. In one embodiment, input signal 216 is a video signal, although embodiments of the invention are not so limited as input signal 216 can be any type of information-bearing signal (e.g., audio or data signals). FIG. 3 illustrates the frequency spectrum of an example of input signal 216. In particular, FIG. 3 includes frequency spectrum 302 that has a range between low frequency (fL) 304 and high frequency (fH) 306.

Amplifier 202 and gain control circuitry 203 scale the amplitude of input signal 216 such that its maximum amplitude value is lower than the maximum input amplitude required by the wide bandwidth input for A/D converter 208. For more information concerning gain control circuitry 203, see copending/cofiled application Ser. No. 09/517,685, filed on Mar. 2, 2000, now issued as U.S. Pat. No. 6,292,120 issued on Sep. 18, 2001, entitled "Automatic Gain Control for Input to Analog to Digital Converter" by inventors Dean Painchaud and Lawrence Wachter.

Figure 4:
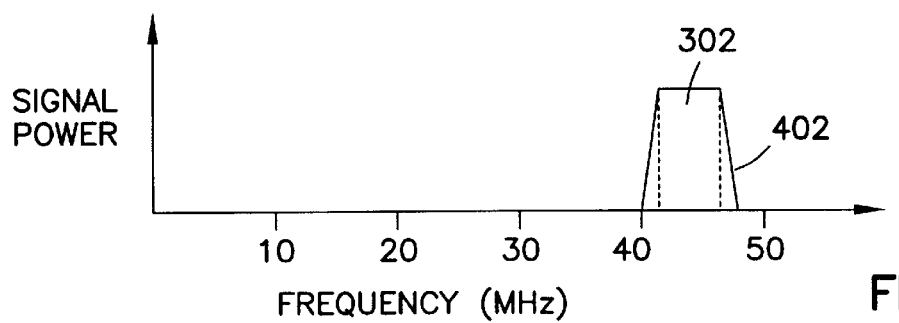
FIG. 4 illustrates an embodiment of a bandpass shape for a bandpass filter according to the teachings of the present invention.

Accordingly, the scaled input signal that is outputted from amplifier 202 is inputted into bandpass filter 204. Bandpass filter 204 filters this scaled input signal to remove noise outside of the frequency range shown in FIG. 3. In particular, bandpass filter 204 has a passband whose shape is illustrated in FIG. 4 (i.e., bandpass shape 402). Further, this scaled input signal is inputted into frequency response equalization circuitry 206, which corrects for the frequency response distortion induced on the signal by bandpass filter 204.

Figure 5:
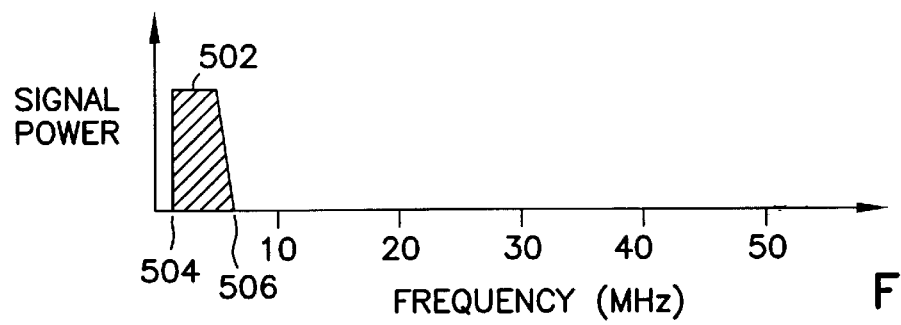
FIG. 5 illustrates an embodiment of a frequency spectrum of an output signal of an analog/digital (A/D) converter according to the teachings of the present invention.

This analog signal is then passed to A/D converter 208. In one embodiment, the A/D converter 208 includes a wide bandwidth at the front end to preclude the distortion of this analog signal, as this signal still contains carrier information. A/D converter 208 converts the analog signal to a digital signal using an undersampling process. In particular, A/D converter 208 samples at a rate lower than the classical Nyquist sampling rate. The Nyquist sampling rate is the minimum sampling rate at which an analog signal can be digitized and fully reconstructed using a digital/analog (D/A) converter. In one embodiment, the Nyquist sampling rate (fN) is given by the frequency two times the highest frequency for the frequency spectrum of the analog signal (i.e., fH). By, sampling at a rate lower than fN, aliasing of the input signal occurs and the frequency spectrum of the A/D output signal is shown in FIG. 5.

In particular, this output sampling rate as well as the low and high frequency of the analog signal (i.e., fL 304 and fH 306) dictate the low and high baseband frequencies (i.e., fBBL 504 and FBBH 506) (the lowest and the highest frequency component of aliased image 502 of the analog signal). One embodiment of the low and high baseband frequencies is illustrated in FIG. 5. As shown in FIG. 5, FBBL 504 is not taken down to zero Hz (i.e., direct current (DC)) but is just above DC, thereby allowing for a guardband between DC and FBBL 504. This guardband is needed if the decoder on the opposing end of the transmission line performs an upconversion process. The upconversion process upconverts this signal back to its original frequency band. However, if the upconversion process is not required, this frequency guardband is not needed. In one embodiment, equation 1 defines the relationship between this output sampling rate (fSAMP ), fBBL and fH:

$$fSAMP=fH/2+fBBL/2 \quad (1)$$

This undersampling process by A/D converter 208 effectively achieves a downconversion of the input signal. In other words, the frequency spectrum of the output signal of the A/D converter 208 is lower than the frequency spectrum of the input signal to the A/D converter 208. Further, in one embodiment as illustrated in FIG. 5, the frequency spectrum of the output signal (i.e., aliased image 502) is a mirror image of the frequency spectrum of the input signal for A/D converter 208 (i.e., frequency spectrum 302). However, the invention is not so limited as a non-mirrored image frequency spectrum can also be achieved by having A/D converter 208 apply a different sampling rate. In one embodiment, the outputted digital signal from A/D converter 208 has a sampling rate of 23.62 Mega-samplings per sec (Msps).

Figure 6:
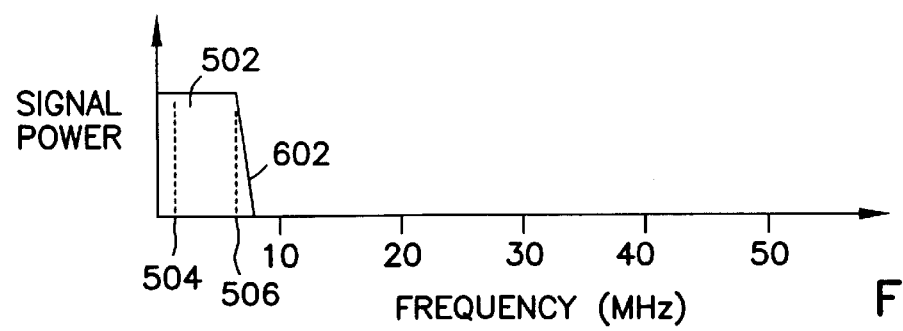
FIG. 6 illustrates an embodiment of a passband shape for a lowpass filter according to the teachings of the present invention.

The digitized signal is then passed through digital filter 210. In one embodiment, digital filter 210 is a lowpass finite impulse response (FIR) digital filter with a passband shown in FIG. 6 (i.e., passband 602). Passband 602 is the fixed output data rate divided by two (i.e., the output Nyquist rate divided by two). Any out-of-band noise and spurious frequency components outside passband 602 aliases into passband 602 during the resampling process, which is more fully described below, and degrade the output signal-to-noise performance of encoder 200. In one embodiment where digital filter 210 is a lowpass FIR digital filter, digital filter-210 is a 64-tap FIR filter with approximately 20 dB of out-of-band rejection. Because in one embodiment the transmission sampling rate outputted by encoder 200 should be 13.524 Msps while the output signal from digital filter 210 has a sampling rate of 23.62 Msps, a non-integer based resampler is needed to convert the sampling rate from 23.62 Msps to 13.524 Msps. Accordingly, the digitized signal is inputted into resampler 212 which, in one embodiment, is asynchronous in nature. In one embodiment, resampler 212 is configured by a microprocessor via the control input interface of resampler 212. In one such embodiment, resampler 212 is programmed to resample at the fractional rate of 13.524/23.62=0.57245081. Moreover, resampler 212 is further described in Digital Signal Processing, Chapter 10, by J. G. Proakis and D. G. Manolakis, Macmillan Publishing, New York, 1992, which is hereby incorporated by reference.

Accordingly, resampler 212 converts the sampling rate of the digitized signal to a fixed data rate independent of the A/D output data rate. In other words, resampler 212 converts the input sampling rate to output sampling rate wherein the input sampling rate is not required to be an integer-based conversion of the output sampling rate.

Advantageously, the embodiment of encoder 200 and equivalents thereof is able to receive and process both narrowband (i.e., less than 500 kHz) and wideband (i.e., greater than 500 kHz) bandpass signals. Moreover, such encoders allow for extensibility (i.e., programmability), as a relatively minimum amount of analog circuitry is used with a majority of the signal processing and formatting of the signal being performed digitally. In particular, this scalable architecture allows for the digitization of bandpass input signals such that different input signals at different passbands can be digitized and output at the same data rate with minimal modifications in the circuitry. In order to accommodate input signals at differing passbands, for example, modifications can include changing the passband on the analog filter, the A/D sampling rate on the A/D converter and/or the resampling ratio on the resampler.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the data rates as well as the frequency spectrums and the shapes thereof of the analog and digital signal, as described herein, may be varied and still fall within the scope of the present invention.

What is claimed is:

1. An encoder for encoding an analog signal for transmission over a communication link, the encoder comprising:
   an input adapted to receive the analog signal;
   an analog-to-digital (A/D) converter, coupled to the input, that receives the analog signal and downconverts and digitizes the analog signal without analog mixing of the analog signal;
   a resampler coupled to the A/D converter that receives the downconverted digital signal and converts the downconverted digital signal to an output signal at a data rate independent of a data rate of the digitized analog signal; and
   an output, coupled to the resampler, the output adapted to be coupled to the communication link for transmitting the output signal over the communication link to a remote decoder.

2. The encoder of claim 1, wherein the analog signal has a frequency bandwidth selected from the group consisting of narrowband and wideband.

3. An encoder for encoding an analog signal for transmission over a communication link, the encoder comprising:
   an input adapted to receive the analog signal;
   an analog-to-digital (A/D) converter, coupled to the input, that receives the analog signal that has a frequency spectrum, wherein the A/D converter lowers the frequency spectrum of the analog signal and digitizes the analog signal;
   an asynchronous resampler coupled to the A/D converter that receives the digital signal and converts the digital signal to an output signal having an output data rate independent of a data rate of the digitized analog signal; and
   an output, coupled to the resampler, the output adapted to be coupled to the communication link for transmitting the output signal over the communication link to a remote decoder.

4. The encoder of claim 3, wherein a ratio of the data rate of the digitized analog signal to the output data rate is non-integer based.

5. The encoder of claim 3, wherein the A/D converter comprises a wide bandwidth A/D converter.

6. The encoder of claim 4, further comprising a gain control circuitry coupled to the A/D converter, wherein the gain control circuitry scales an amplitude of the analog signal such that a maximum amplitude of the analog signal is lower than a maximum input amplitude required by the A/D converter.

7. The encoder of claim 3, wherein the A/D converter has a clock input that allows a sampling rate of the A/D converter to be adjusted.

8. The encoder of claim 3, wherein the A/D converter samples the analog signal at a rate lower than a Nyquist sampling rate.

9. An encoder for encoding an analog signal for transmission over a communication link, the encoder comprising:
an input adapted to receive the analog signal;
an analog-to-digital (A/D) converter, coupled to the input, that receives the analog signal and downconverts and digitizes the analog signal independent of an analog mixing of the analog signal, such that a sampling rate of the A/D converter is less than a Nyquist sampling rate;
a resampler coupled to the A/D converter that receives the downconverted digital signal and converts the downconverted digital signal to an output signal having a data rate independent of a data rate of the digitized analog signal; and
an output, coupled to the resampler, the output adapted to be coupled to the communication link for transmitting the output signal over the communication link to a remote decoder.

10. The encoder of claim 9, wherein the resampler is asynchronous.

11. An encoder for encoding an analog signal for transmission over a communication link, the encoder comprising:
an input adapted to receive the analog signal;
an analog-to-digital (A/D) converter, coupled to the input, that receives the analog signal and samples the analog signal at a rate that is lower than a Nyquist sampling rate to produce a digital signal with a frequency spectrum that is lower than a frequency spectrum of the analog signal;
a resampler coupled to the A/D converter that receives the digitized signal and converts the digitized signal to an output signal having a data rate that is independent of a data rate of the sampled analog signal, such that a ratio of the data rate of the sampled analog signal to the data rate of the output signal is non-integer based; and
an output, coupled to the resampler, the output adapted to be coupled to the communication link for transmitting the output signal over the communication link to a remote decoder.

12. The encoder of claim 11, wherein the frequency spectrum of the analog signal is selected from the group consisting of narrowband and wideband.

13. An encoder comprising:
a gain control circuitry that receives an analog signal and scales an amplitude of the analog signal, wherein the analog signal has a frequency range;
an analog bandpass filter coupled to the gain control circuitry, wherein the analog bandpass filter bandpass filters the analog signal such that a bandpass band includes the frequency spectrum of the analog signal;
a frequency response equalization circuit coupled to the analog bandpass filter, wherein the frequency response equalization circuit receives the analog signal and lowers distortion in the analog signal;
an analog-to-digital (A/D) converter coupled to the frequency response circuit, wherein the A/D converter receives the analog signal and lowers a frequency spectrum of the analog signal and digitizes the analog signal;
a lowpass filter coupled to the A/D converter, wherein the lowpass filter lowpass filters the digital signal such that a lowpass band includes the frequency spectrum of the digital signal; and
a resampler coupled to the lowpass filter that receives the digital signal and converts the digital signal to a fixed data rate output signal independent of a data rate of the digitized analog signal.

14. The encoder of claim 13, wherein the lowpass filter comprises a finite impulse response filter.

15. The encoder of claim 13, wherein a sample rate of the A/D converter is programmable.

16. The encoder of claim 13, wherein the resampler is programmable.

17. A method of encoding an analog signal for transmission over a communication link, the method comprising:
receiving the analog signal;
digitizing the analog signal to generate a digital signal, wherein a frequency spectrum of the digital signal is lower than a frequency spectrum of an analog signal;
converting the digital signal to an output signal having a fixed data rate independent of a data rate of the digitized analog signal; and
transmitting the output signal over a communication link to a remote decoder.

18. The method of claim 17, wherein the frequency spectrum of the analog signal is selected from the group consisting of narrowband and wideband.

19. A method of encoding an analog signal for transmission over a communication link, the method comprising:
receiving the analog signal;
downconverting the analog signal without analog mixing;
converting the downconverted analog signal to a downconverted digital signal;
resampling the downconverted digital signal to generate an output signal having a fixed data rate that is independent of a data rate of the downconverted digital signal; and
transmitting the output signal over a communication link to a remote decoder.

20. The method of claim 19, wherein a ratio of the data rate of the downconverted digital signal to the fixed data rate of the output signal is non-integer based.

21. The method of claim 19, wherein downconverting the analog signal includes sampling at a rate that is less than a Nyquist sampling rate.

22. A method for encoding an analog signal for transmission over a communication link the method comprising:
receiving the analog signal;
digitizing the analog signal to generate a digitized signal, wherein a frequency range of the digitized signal is lower than a frequency range of the analog signal;
converting a data rate of the digital signal to an output signal with an output data rate, such that a ratio of an input data rate of the digitized analog signal to the output data rate is non-integer based; and transmitting the output signal over a communication link to a remote decoder.

23. The method of claim 22, wherein digitizing the analog signal includes sampling the analog signal at a rate lower than a Nyquist sampling rate.

24. A method of encoding an analog signal for transmission over a communication link, the method comprising:

receiving the analog signal;

digitizing the analog signal to generate a digitized signal such that the analog signal is sampled at a rate that is lower than a Nyquist sampling rate, wherein a frequency spectrum of the digitized signal is lower than a frequency spectrum of the analog signal independent of analog mixing of the analog signal;

converting the digitized signal to an output signal having a data rate that is independent of a data rate of the digitized analog signal, such that a ratio of the data rate of the digitized analog signal to the data rate of the output signal is non-integer based, and transmitting the output signal over a communication link to a remote decoder.

25. The method of claim 24, wherein the frequency spectrum of the analog signal is selected from the group consisting of narrowband and wideband.

26. A communication system, comprising:

a modulator that receives an analog signal and modulates the analog signal onto a carrier signal;

a first transmission device coupled to the modulator that receives the carrier signal, the first transmission device includes an encoder that includes:

an analog-to-digital (A/D) converter that receives the carrier signal and downconverts and digitizes the analog signal without analog mixing of the analog signal; and a resampler coupled to the A/D converter that receives the downconverted digital signal and converts the downconverted digital signal to an output signal at a data rate independent of a data rate of the digitized analog signal; and a second transmission device coupled to the first transmission device that receives the output signal and generates a reconstructed analog signal from the digital signal, wherein the reconstructed analog signal is approximately equal to the analog signal.

27. The communication system of claim 26, wherein the first transmission device is coupled to the second transmission device through a fiberoptic line.

28. The communication system of claim 26, wherein digitizing the analog signal includes sampling the analog signal at a rate lower than a Nyquist sampling rate.

29. The communication system of claim 26, wherein a sample rate of the A/D converter is programmable.

30. The communication system of claim 26, wherein the resampler is programmable.

31. A system for encoding and transmitting an analog signal, comprising:

a modulator that receives the analog signal and modulates the analog signal onto a carrier signal; and a first transmission device coupled to the modulator that receives the carrier signal, wherein the first transmission device includes an encoder that includes:

an analog-to-digital (A/D) converter that receives the analog signal that has a frequency spectrum, wherein the A/D converter lowers the frequency spectrum of the analog signal and digitizes the analog signal; and an asynchronous resampler coupled to the A/D converter that receives the digital signal and converts the digital signal to an output signal having an output data rate, such that a ratio of the input data rate to the output data rate is non-integer based; and a second transmission device coupled to the first transmission device that receives the output signal and generates a reconstructed analog signal from the digital signal, wherein the reconstructed analog signal is approximately equal to the analog signal.

32. The system of claim 31, wherein the analog signal has a frequency bandwidth selected from the group consisting of narrowband and wideband.

33. A system for encoding and transmitting an analog signal, the system comprising:

a modulator that receives the analog signal and modulates the analog signal onto a carrier signal; and a first transmission device coupled to the modulator that receives the carrier signal, wherein the first transmission device includes an encoder that includes:

an analog-to-digital (A/D) converter that receives the analog signal and downconverts and digitizes the analog signal independent of a frequency band of the analog signal;

a resampler coupled to the A/D converter that receives the downconverted digital signal and converts the downconverted digital signal to an output signal at a data rate independent of a data rate of the digitized analog signal; and a second transmission device coupled to the first transmission device that receives the output signal and generates a reconstructed analog signal from the digital signal, wherein the reconstructed analog signal is approximately equal to the analog signal.

34. The system of claim 33, wherein the A/D converter comprises a wide bandwidth A/D converter.

35. The system of claim 34, further comprising a gain control circuitry coupled to the A/D converter, wherein the gain control circuitry scales an amplitude of the analog signal such that a maximum amplitude of the analog signal is lower than a maximum input amplitude required by the front end of the A/D converter.

36. The system of claim 33, wherein the A/D converter samples the analog signal at a rate lower than a Nyquist sampling rate.

37. A system for encoding and transmitting an analog signal, the system comprising:

a modulator that receives the analog signal and modulates the analog signal onto a carrier signal; and a first transmission device coupled to the modulator that receives the carrier signal, wherein the first transmission device includes an encoder that includes:

an analog-to-digital (A/D) converter that receives the analog signal and digitizes the analog signal to generate a digitized signal such that the analog signal is sampled at a rate that is lower than a Nyquist sampling rate, wherein a frequency spectrum of the digitized signal is lower than a frequency spectrum of the analog signal independent of analog mixing of the analog signal;

a resampler coupled to the A/D converter that receives the digitized signal and converts the digitized signal to an output signal having a data rate that is independent of a data rate of the digitized signal, such that a ratio of the data rate of the digitized signal to the data rate of the output signal is non-integer based; and a second transmission device coupled to the first transmission device that receives the output signal and generates a reconstructed analog signal from the digital signal, wherein the reconstructed analog signal is approximately equal to the analog signal.

* * * * *